United States Patent [19]

Smith et al.

[11] Patent Number: 5,491,414
[45] Date of Patent: Feb. 13, 1996

[54] METHOD OF NUCLEAR QUADRUPOLE RESONANCE TESTING OF INTEGRAL SPIN QUANTUM NUMBER SYSTEMS

[75] Inventors: John A. S. Smith, London, England; Julian D. Shaw, Encinitas, Calif.

[73] Assignee: British Technology Group Limited, London, England

[21] Appl. No.: 244,487

[22] PCT Filed: Dec. 4, 1992

[86] PCT No.: PCT/GB92/02254

§ 371 Date: Dec. 4, 1992

§ 102(e) Date: Dec. 4, 1992

[87] PCT Pub. No.: WO93/11441

PCT Pub. Date: Jun. 10, 1993

[30] Foreign Application Priority Data

Dec. 5, 1991 [GB] United Kingdom .................... 9125883

[51] Int. Cl.$^6$ ................................................. G01R 33/20
[52] U.S. Cl. ................................................. 324/307
[58] Field of Search ................................ 324/307, 309, 324/300, 314, 318

[56] References Cited

U.S. PATENT DOCUMENTS

| | | | |
|---|---|---|---|
| 4,887,034 | 12/1989 | Smith | 324/307 |
| 5,175,499 | 12/1992 | Davies | 324/300 |
| 5,206,592 | 4/1993 | Buess et al. | 324/307 |
| 5,365,171 | 11/1994 | Buess et al. | 324/307 |

FOREIGN PATENT DOCUMENTS

| | | |
|---|---|---|
| 471825 | 6/1978 | U.S.S.R. . |
| 757947 | 8/1980 | U.S.S.R. . |
| 958935 | 9/1982 | U.S.S.R. . |
| 2oo462 | 8/1988 | United Kingdom . |
| 2254923 | 10/1992 | United Kingdom . |

OTHER PUBLICATIONS

Marino et al, "Multiple Spin Echoes in Pure Quadruple Resonance," J. of Chem. Phys. vol. 67 (7) pp. 3388–3389 (Oct. 1977).

Bogulavskii et al: "Automatic Nuclear–Quadrupole–Resonance Measurements Using an Elektronika D3–28 Microcomputer" translated from Pribory i Tekhnika Eksperimenta, No. 2, pp. 150–152, Mar.–Apr. 1985.

Gonano: "Nuclear Magnetic Resonance and Nuclear Quadrupole Resonance for Bomb Detection" Eletro 1979 Conference Record, pp. 1–5.

Bielecki et al: "Zero–Field NMR and NQR Spectrometer", American Institute of Physics–Rev. Sci. Instrum. 57 (3) Mar. 1986–pp. 393–403.

Bloom et al: "Free Magnetic Induction in Nuclear Quadrupole Resonance", Physical Review–vol. 97, No. 6, pp. 1699–1709 (1955).

Bloom et al: "Transient Nuclear Induction Signals Associated with Pure Quadupole Interactions", Physical Review vol. 93, p. 638, (1954).

Hahn et al: "Anosptropic Relaxation of Quadrupole Spin Echoes" Physical Review, vol. 93, (1954), p. 639.

Grehicskin et al, Adv. NQR, vol. 5, pp. 2–5 and 16, 1983.

*Primary Examiner*—Sandra L. O'Shea
*Assistant Examiner*—Raymond Y. Mah
*Attorney, Agent, or Firm*—Cushman, Darby & Cushman

[57] ABSTRACT

A method of Nuclear Quadrupole Resonance testing includes the steps of applying to a sample in which selected nuclei have an integral spin quantum number a series of at least three pulses of electromagnetic waves at a single radiofrequency to excite quadrupole resonance of the selected nuclei, and detecting responses at a plurality of times when echo response signals are expected to occur.

13 Claims, 2 Drawing Sheets

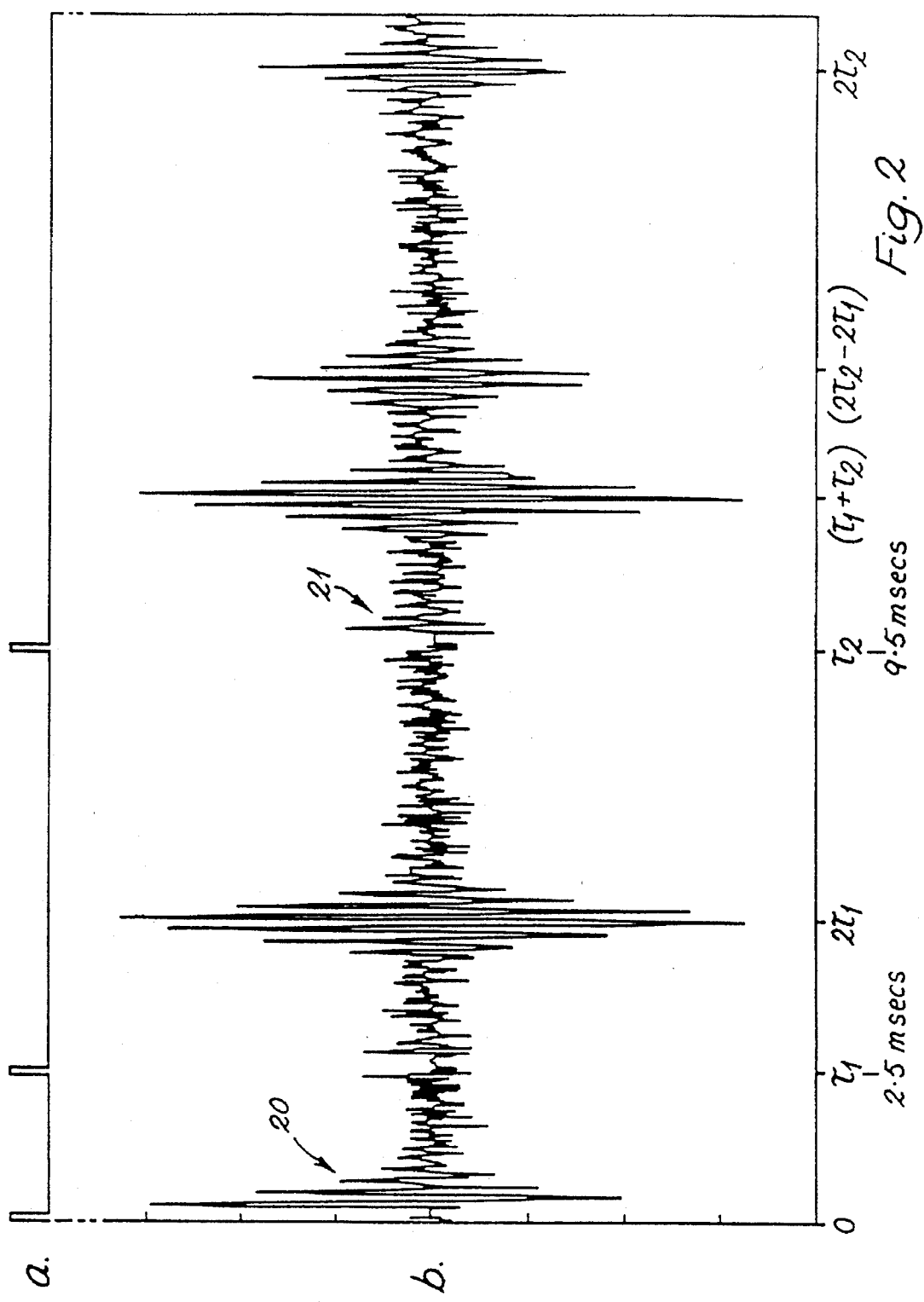

METHOD OF NUCLEAR QUADRUPOLE RESONANCE TESTING OF INTEGRAL SPIN QUANTUM NUMBER SYSTEMS

FIELD OF THE INVENTION

The present invention relates to a method of nuclear quadrupole resonance (NQR) testing of integral spin quantum number spin systems.

DESCRIPTION OF RELATED ART

NQR testing is used for detecting the presence or disposition of specific substances. It depends on the energy levels of quadrupolar nuclei, which have a spin quantum number greater than one-half. Quadrupolar nuclei having an integral spin quantum number (that is, I=1, 2, 3 . . . ) include $^{14}N$ (I=1). $^{14}N$ nuclei are present in a wide range of substances, including animal tissue, bone, food-stuffs, explosives and drugs.

In the sub-molecular environment of compounds or crystals, the nature and disposition of the electrons and atomic nuclei produce an electric field gradient which modifies the nuclear energy levels to such an extent that measurements of NQR effects can indicate not merely the nuclei which are present but also their chemical environment, thus indicating specific substances or types of substances in any tested sample.

In NQR testing a sample is irradiated with pulses or sequences of pulses of radiofrequency electromagnetic waves having a frequency which is at or very close to a resonant frequency of quadrupolar nuclei in a substance which is to be detected. If the substance is present, the irradiant energy will raise at least some of the nuclei to a higher energy level. Such nuclei will tend to return to their normal state and in doing so they will emit radiation at their resonance frequency or frequencies which can be detected as a free induction decay (f.i.d.) during a decay period after each pulse. These emissions decay at a rate which depends on two relaxation time constants, $T_1$ and $T_2$.

In conventional NQR testing, either a substantial part of the free induction decay is measured after each pulse or the responses are measured as echoes in relatively short sampling periods between or following a relatively rapid succession of pulses. Usually the results from a number of test pulses or test sequences are integrated to improve the signal-to-noise ratio. Various schemes of pulse sequences have been used.

In a scientific paper by Grechiskin et al. (Adv. N.Q.R., 1983, 5, 1) it has been predicted theoretically that conditions might arise which could give rise to the formation of a single echo as well as a free induction decay from nuclei of unity spin quantum number when excited by two excitation pulses at a single radiofrequency. No details are given as to how, or even whether, this can be achieved experimentally.

In a paper by Bloom et al. (Physical Review 1955, vol. 97, 1699) it has been reported that multiple echoes as well as a free induction decay have been observed in tests from nuclei of spin quantum number 3/2 in a weak magnetic field. The paper demonstrates that the magnetic field removes degeneracies which would otherwise so broaden and attenuate the echoes that no useful NQR information would be yielded. However, this technique would not be expected to work for integral spin systems, since such systems are not strongly affected by a wear applied magnetic field.

SUMMARY OF THE INVENTION

According to the present invention, a method of NQR testing includes the steps of applying to a sample in which selected nuclei have an integral spin quantum number a series of at least three excitation pulses of electromagnetic waves at a single radiofrequency to excite quadrupole resonance of the selected nuclei and detecting responses at a plurality of times when echo response signals are expected to occur, the excitation pulses being arranged to generate more echo response signals than the number of applied pulses.

We have found that, surprisingly, for samples in which the selected nuclei have an integral (e.g. unity) spin quantum number, in addition to the free induction decay which occurs immediately after a single frequency excitation pulse, there are some substantial NQR echo responses which occur after delays matching the time intervals between preceding pulses. It has been found that, if time $\tau$ is measured from the first pulse of a series of pulses of pre-selected widths and phases occurring at times $0, \tau_1, \tau_2 \ldots \tau_N$ which are not necessarily identically spaced there are substantial echo responses at many, although not all of, the following times:

$$\tau_n + \tau_n = 2\tau_n$$
$$\tau_n + (\tau_n - \tau_1) = 2\tau_n - \tau_1$$
$$\vdots$$
$$\tau_n + (\tau_n - \tau_{n-1}) = 2\tau_n - \tau_{n-1}$$

where n=1 to N. It has also been found that there can be echo responses which occur after a delay which matches the time interval between an excitation pulse and a echo response which precedes it, for instance at times $$\tau_n + (\tau_n - 2\tau_1) = 2\tau_n - 2\tau_1.$$

The times when echo response signals would be expected to occur for a particular substance or class of substance can be predetermined by experimentation in a manner which will be evident to a person skilled in the art.

It will be appreciated that, since more (often many more) echoes may be detected from the sample than excitation pulses are applied to the sample, and since the usual f.i.d.'s may also be detected, a larger signal-to-noise ratio can be obtained than would be obtained for a system in which a multiple echo train was not generated; the sensitivity of the tests can thus be improved. Therefore, it is preferred that the responses to the excitation pulses are summed.

For simplicity and economy, it is preferred that the application and detection steps take place in the absence of an applied magnetic field (e.g. non-radio frequency magnetic field).

Preferably, the interval between the first and second pulses of the series is different from the interval between the second and third pulses. It has now been discovered that, using such intervals, stimulated NQR echoes can be generated, with the attendant possibility of there being more echoes generated and detected than there are pulses applied. This can in turn afford the advantage of larger signal-to-noise ratio and increased sensitivity mentioned previously.

The pulse times $\tau_n$ are preferably chosen to have no common factor and so that the echo times are distinct and separated from the excitation pulse times. Preferably $\tau_n > 2\tau_{n-1}$ and in some cases it may be necessary to have the condition $2\tau_N < T_1$ where $T_1$ is the spin-lattice relaxation time for the resonance being tested. The time intervals $(\tau_n - \tau_{n-1})$ may be greater than those used in conventional NQR test pulse sequences; usually $(\tau_n - \tau_{n-1}) > T_2^*$, where $T_2^*$ is the f.i.d. time.

In a preferred embodiment, the pulses of the series are applied at times 0, $\tau_1$ and $\tau_2$ and the echo response signals are measured in periods embracing at least some of the times $2\tau_1$, $\tau_1+\tau_2$, $2\tau_2$ and $2\tau_2-2\tau_1$. It is also preferred that $\tau_2>2\tau_1$ and $\tau_1$ and $\tau_2$ have values which make the times $\tau_1$, $\tau_2$, $2\tau_1$, $\tau_1+\tau_2$, $2\tau_2-2\tau_1$ and $2\tau_2$ separate and distinct from one another.

If pulses are applied to the sample at times 0, $\tau_1$ and $\tau_2$, it has been found that there may be little or no substantial echo response at time $2\tau_1-\tau_1$ for integral spin quantum number systems. This fact can be used effectively to perpetuate or at least prolong the echo train. A further excitation pulse may be applied at time $2\tau_2-\tau_1$. This will produce further echoes without suppressing or affecting the quality of detectable NQR information. Additional pulses may be applied at some or all of times $(2\tau_n-\tau_{n-1})$ (n=3, 4, 5 ...) to further prolong the multiple echo train. There may be times other than $(2\tau_n-\tau_{n-1})$ when there are no substantial echo responses. In this case, the further excitation pulses could be applied at these times additionally or instead.

BRIEF DESCRIPTION OF THE DRAWINGS

Preferred features of the invention will now be described with reference to the accompanying drawings, in which:

FIG. 2 is a graphical diagram showing response signals detected in a test with the apparatus of FIG. 1.

DESCRIPTION OF PREFERRED EMBODIMENTS

Figure 1:
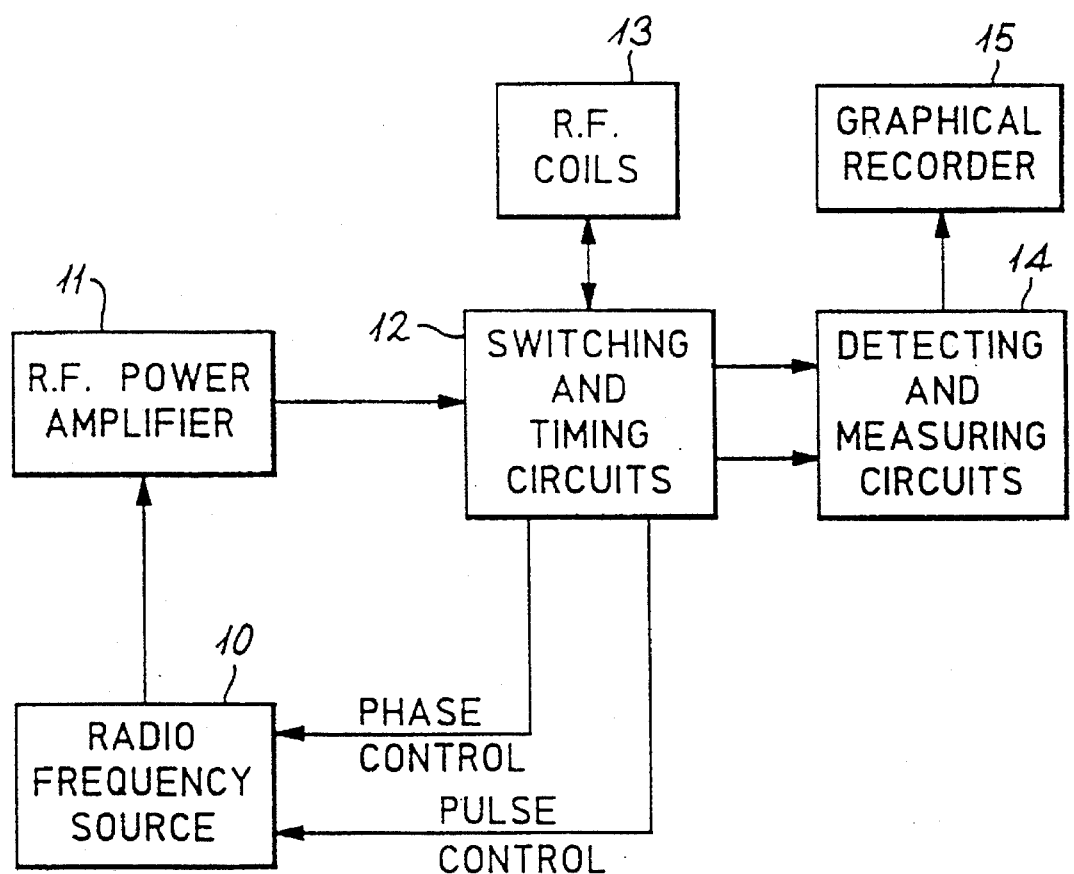
FIG. 1 is a block circuit diagram of apparatus for NQR testing.

In FIG. 1 a radiofrequency source 10 is connected to an rf power amplifier 11. The output of rf amplifier 11 is connected through switching and timing circuits 12 to r.f. coils 13 which are disposed about the sample to be tested (not shown). The switching and timing circuits 12 also connect the coils 13 to a detecting and measuring circuit 14, which is also connected to a graphical recorder 15. The switching and timing circuits 12 also control the timing and phase of the signals applied by the r.f. source 10 to the r.f. power amplifier 11. It will be appreciated that numerous modifications to the apparatus described are possible, as will be apparent to the skilled person.

In FIG. 2 waveform (a) represents the excitation pulse control signals applied to control a series of three single frequency excitation pulses, and waveform (b) represents the graphical recorder trace of detected NQR responses. A time scale is shown below this trace. As shown, the excitation pulses occurred at times $\tau=0$, 2.5 ms ($\tau_1$) and 9.5 ms ($\tau_2$). The pulse sequence was of the form $90°_o-\tau_1-90°_o-\tau_2-90°_o-$. Each excitation pulse lasted for 20 µs and was followed by a blanking period of 200 µs; during these times the detecting circuit was not connected to the coils, to avoid overload. In this particular test the single radiofrequency $f_o$ of the excitation pulses (5307 KHz) was slightly offset from one of the resonance frequencies $f_r$=5302 kHz of $^{14}N$ nuclei in the sample, which was a sample quantity of the explosive HMX at a temperature close to 298K. This produces a response showing variations at the beat frequency $f_o-f_r$. The trace clearly shows the NQR echo responses occurring around the times $2\tau_1$, $\tau_2+\tau_1$, $2\tau_2-2\tau_1$, and $2\tau_2$. A possible response at $2\tau_2-\tau_1$ is either very weak or is thought perhaps not to exist at all. Parts 20 and 21 of the trace show the f.i.d.s after the first and third excitation pulses; the f.i.d. after the second pulse does not appear on this trace which shows the output of only one of two channels arranged to measure signals of opposite phase. The excitation signals in the second pulse may be in antiphase relationship with the signals of the first and third pulses.

From this trace it is clear that the three pulses generate at least four substantial echo reponse signals which in this instance are comparable with the largest measurable f.i.d. It will be noted that each of the echo responses is spread over a period of about 1 millisecond which is about twice the f.i.d. time constant $T_2^*$ and is fifty times longer than the excitation pulse length. The strength and duration of the echo responses are so great that by using them in addition to the f.i.d.'s the sensitivity of the tests can be greatly increased.

It will be understood that the present invention has been described above purely by way of example, and modifications of detail can be made within the scope of the invention.

We claim:

1. A method of NQR testing which includes the steps of:

applying to a sample in which selected nuclei have an integral spin quantum number, a series of at least three excitation pulses of electromagnetic waves at a single radiofrequency to excite quadrupole resonance in said selected nuclei; and detecting echo response signals from said sample at a plurality of times;

said series of at least three excitation pulses being arranged in time to generate a greater number of said echo response signals in a predetermined substance than a number of said at least three excitation pulses.

2. A method as claimed in claim 1, wherein said echo response signals are summed.

3. A method as claimed in claim 1, wherein said step of applying said series of at least three excitation pulses and said step of detecting said echo response signals from said sample take place in an absence of any applied non-radiofrequency magnetic field.

4. A method as claimed in claim 1, wherein a first interval between a first pulse of said series of at least three excitation pulses and a second pulse of said series of at least three excitation pulses is different from a second interval between said second pulse of said series of at least three excitation pulses and a third pulse of said series of at least three excitation pulses.

5. A method as claimed in claim 1, wherein:

said step of applying said series of at least three excitation pulses includes a step of applying three pulses at times 0, $\tau_1$ and $\tau_2$, respectively; and said echo response signals are detected in periods embracing at least one of times $2\tau_2$, $\tau_1+\tau_2$, $2\tau_2$ and $2\tau_2-2\tau_1$.

6. A method as claimed in claim 5, wherein:

$\tau_2>2\tau_1$; and $\tau_1$, $\tau_2$, $2\tau_1$, $\tau_1+\tau_2$, $2\tau_2-2\tau_1$ and $2\tau_2$ are times separate and distinct from one another.

7. A method as claimed in claim 5, wherein $\tau_1$ is greater than one millisecond.

8. A method as claimed in claim 1, wherein:

said pulses of said series of at least three excitation pulses are applied at times $\tau_n$, where n=0 to N and N is greater than or equal to two; and at least one of said pulses of said series of at least three excitation pulses being applied at a respective time $2\tau_m - \tau_{m-1}$, with m being greater than one for such respective time.

9. A method as claimed in claim 5, wherein a further pulse in said series of at least three excitation pulses is applied at a time $2\tau_n - \tau_{n-1}$, n being greater than one.

10. A method as claimed in claim 1, wherein, each of said series of at least three excitation pulses which is interposed between two other adjacent pulses of said series of at least three excitation pulses is not equally spaced between said two other adjacent pulses.

11. A method as claimed in claim 1, wherein:

said step of applying said series of at least three excitation pulses includes a step of applying three pulses at times 0, $\tau_1$ and $\tau_2$, respectively; and said echo response signals are detected in periods embracing at least one of times $2\tau_1$, $\tau_1 + \tau_2$, $2\tau_2$ and $2\tau_2 - 2\tau_1$.

12. A method as claimed in claim 5, wherein a further pulse in said series of at least three excitation pulses is applied at time $2\tau_2 - \tau_1$.

13. A method of NQR testing which includes the steps of:

applying to a sample in which selected nuclei have an integral spin quantum number, a series of at least three excitation pulses of electromagnetic waves at a single radiofrequency to excite quadrupole resonance in said selected nuclei; and determining a plurality of times when echo response signals are expected to occur in said sample;

detecting echo response signals from said sample at said plurality of times when echo response signals are expected to occur;

said series of at least three excitation pulses being arranged in time to generate a greater number of said echo response signals in a predetermined substance than a number of said at least three excitation pulses.

* * * * *